United States Patent
Yamashita

(10) Patent No.: US 9,407,235 B2
(45) Date of Patent: Aug. 2, 2016

(54) ACOUSTIC WAVE DEVICE

(71) Applicant: TAIYO YUDEN CO., LTD., Tokyo (JP)

(72) Inventor: Takashi Yamashita, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 141 days.

(21) Appl. No.: 14/303,158

(22) Filed: Jun. 12, 2014

(65) Prior Publication Data

US 2014/0368299 A1 Dec. 18, 2014

(30) Foreign Application Priority Data

Jun. 13, 2013 (JP) ................................. 2013-124853

(51) Int. Cl.
| | | |
|---|---|---|
| *H03H 9/64* | (2006.01) | |
| *H03H 9/54* | (2006.01) | |
| *H03H 9/05* | (2006.01) | |
| *H03H 9/10* | (2006.01) | |

(52) U.S. Cl.
CPC ............. *H03H 9/059* (2013.01); *H03H 9/1071* (2013.01); *H03H 9/1078* (2013.01); *H03H 9/6483* (2013.01); *H03H 9/0576* (2013.01)

(58) Field of Classification Search
CPC .......... H03H 9/02133; H03H 9/02897; H03H 9/02952; H03H 9/0514; H03H 9/0523; H03H 9/059; H03H 9/1071; H03H 9/1078; H03H 9/54; H03H 9/64; H03H 9/6483; H03H 9/0576
USPC .......................... 333/133, 187, 189, 193, 195; 310/313 R, 313 B, 313 D, 340, 344, 348
See application file for complete search history.

(56) References Cited

U.S. PATENT DOCUMENTS

| | | | | |
|---|---|---|---|---|
| 6,166,476 A | * | 12/2000 | Nakashima | ............ H03H 9/059 310/313 R |
| 6,417,574 B1 | * | 7/2002 | Misawa | ................. H03H 9/059 257/737 |
| 2002/0037631 A1 | | 3/2002 | Mimata | |
| 2002/0057034 A1 | * | 5/2002 | Ishikawa | ................ H03H 9/059 310/313 B |

(Continued)

FOREIGN PATENT DOCUMENTS

| | | | |
|---|---|---|---|
| JP | 8-213873 | * | 8/1996 |
| JP | 8-330880 | * | 12/1996 |

(Continued)

OTHER PUBLICATIONS

English language machine translation of JP 2000-091880, published Mar. 31, 2000, 6 pages total.*

(Continued)

*Primary Examiner* — Barbara Summons
(74) *Attorney, Agent, or Firm* — Chen Yoshimura LLP

(57) ABSTRACT

An acoustic wave device includes: a chip; an acoustic wave element formed on a principal surface of the chip; a first pad formed on the principal surface of the chip and electrically connected to the acoustic wave element; a substrate having a principal surface facing the principal surface of the chip; a second pad formed on the principal surface of the substrate; a first bump formed between the first pad and the second pad and electrically connecting the first pad and the second pad; and a second bump formed between the chip and the substrate and making direct contact with the substrate.

9 Claims, 10 Drawing Sheets

(56) References Cited

U.S. PATENT DOCUMENTS

| | | | |
|---|---|---|---|
| 2002/0180307 A1* | 12/2002 | Taga | H03H 9/02834 310/313 R |
| 2010/0060372 A1* | 3/2010 | Funahashi | H03H 9/0071 333/5 |
| 2012/0229991 A1 | 9/2012 | Toyota | |

FOREIGN PATENT DOCUMENTS

| | | | |
|---|---|---|---|
| JP | 2000-91880 | * | 3/2000 |
| JP | 2002-100588 A | | 4/2002 |
| JP | 2003-152500 | * | 5/2003 |
| JP | 2004-7372 | * | 1/2004 |
| JP | 2007-184690 | * | 7/2007 |
| JP | 2012-186761 A | | 9/2012 |

OTHER PUBLICATIONS

English language machine translation of JP 2007-184690, published Jul. 19, 2007, 9 pages total.*

* cited by examiner

ACOUSTIC WAVE DEVICE

CROSS-REFERENCE TO RELATED APPLICATION

This application is based upon and claims the benefit of priority of the prior Japanese Patent Application No. 2013-124853, filed on Jun. 13, 2013, the entire contents of which are incorporated herein by reference.

FIELD

A certain aspect of the present invention relates to an acoustic wave device.

BACKGROUND

Acoustic wave devices are used in mobile communication devices such as mobile phones. In recent years, the diversification and the high performance of the system of the mobile communication device requires the acoustic wave device to be reduced in size and height. Japanese Patent Application Publication Nos. 2002-100588 and 2012-186761 disclose a method of thinning a chip. The thinning of the chip allows the acoustic wave device to be reduced in size and height.

There has been a mounting method that makes the lower surface of the thinned chip face the upper surface of a substrate and flip-chip bonds the chip to the substrate by using a bump. When the aforementioned mounting method is applied to the acoustic wave device, an underfill cannot be formed between the upper surface of the substrate and the lower surface of the chip. This is because an excitation electrode exciting an acoustic wave is formed on the lower surface of the chip. Covered with the underfill, the excitation electrode is unable to excite the acoustic wave. The underfill is not formed in the acoustic wave device, and therefore the chip strength when the chip is pressed from above is low.

To enhance the strength of the chip, it is considered that the number of bumps used in flip-chip bonding is increased. However, as the number of bumps increases, the chip area increases. In addition, the stability of bump bonding decreases. Furthermore, characteristics are affected. Therefore, it is desired to enhance the chip strength without increasing the number of bumps.

SUMMARY OF THE INVENTION

According to an aspect of the present invention, there is provided an acoustic wave device including: a chip; an acoustic wave element formed on a principal surface of the chip; a first pad formed on the principal surface of the chip and electrically connected to the acoustic wave element; a substrate having a principal surface facing the principal surface of the chip; a second pad formed on the principal surface of the substrate; a first bump formed between the first pad and the second pad and electrically connecting the first pad and the second pad; and a second bump formed between the chip and the substrate and making direct contact with the substrate.

DETAILED DESCRIPTION

Figure 1A:
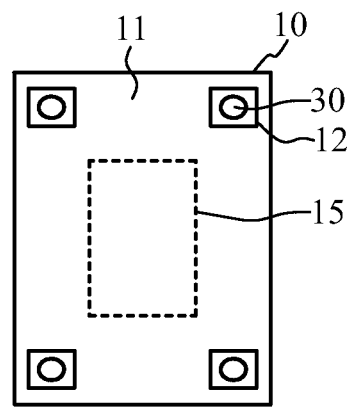
FIG. 1A through FIG. 1C are plan views of an acoustic wave device in accordance with a first comparative example.
Figure 1B:
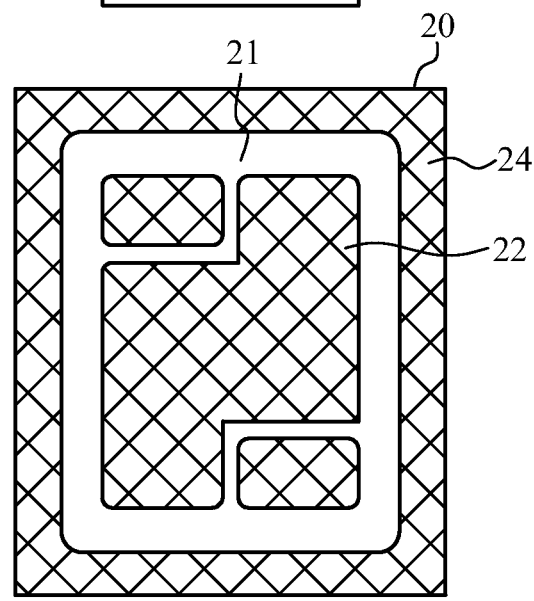
Figure 1C:
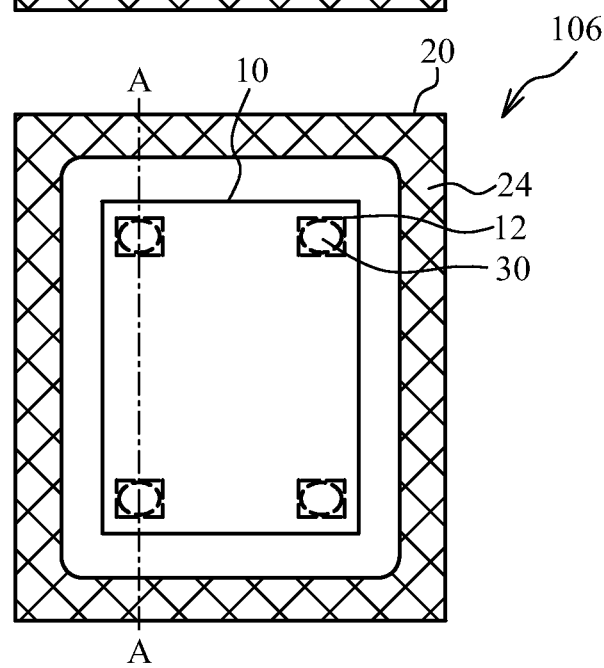

FIG. 1A through FIG. 1C are plan views of an acoustic wave device in accordance with a first comparative example. FIG. 1A is a plan view of a chip, FIG. 1B is a plan view of a substrate, and FIG. 1C is a plan view of the substrate including the chip mounted thereon. Pads and bumps are indicated by the dashed line by illustrating the chip transparently. As illustrated in FIG. 1A, an acoustic wave element 15 is formed on a lower surface 11 of a chip 10. Pads 12 are formed on the lower surface 11 of the chip 10. Bumps 30 are formed on the pads 12. The pads 12 are electrically connected to the acoustic wave element 15.

As illustrated in FIG. 1B, pads 22 and an annular metal layer 24 are formed on an upper surface 21 of a substrate 20. As illustrated in FIG. 1C, in an acoustic wave device 106, the chip 10 is flip-chip mounted on the substrate 20. The bumps 30 are bonded to the pads 22.

Figure 2:
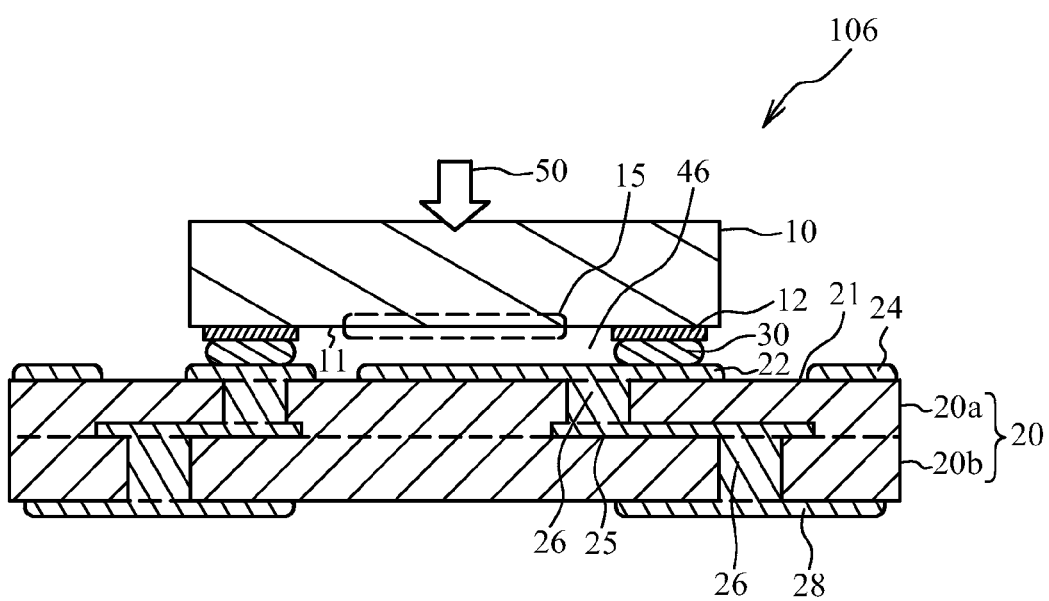
FIG. 2 is a cross-sectional view of the acoustic wave device of the first comparative example.

FIG. 2 is a cross-sectional view of an acoustic wave device in accordance with the first comparative example, and corresponds to a cross-sectional view taken along line A-A in FIG. 1C. The substrate 20 is an insulative substrate, and includes insulating layers 20a and 20b. Wirings 25 and via wirings 26 are formed in the substrate 20. The pads 22 and the annular metal layer 24 are formed on the upper surface 21 of the substrate 20. Foot pads 28 are formed on the lower surface of the substrate 20. The pads 22 are electrically connected to the foot pads 28 through the wirings 25 and the via wirings 26. The chip 10 is flip-chip bonded to the substrate 20 by using the bumps 30.

The acoustic wave element 15 is formed on the lower surface 11 of the chip 10. The acoustic wave element 15 includes an excitation electrode exciting an acoustic wave. The excitation electrode excites the acoustic wave, and thus an air-space 46 is formed between the lower surface 11 of the chip 10 and the upper surface 21 of the substrate 20. Thus, a reinforcing agent such as an underfill cannot be formed between the lower surface 11 of the chip 10 and the upper surface 21 of the substrate 20. Therefore, a breakage or a crack of the chip 10 is caused by impact from the upper surface of the chip 10 indicated by an arrow 50. Especially, when the chip 10 is thinned to reduce the height of the acoustic wave device, a breakage or a crack of the chip 10 easily occurs.

Figure 3A:
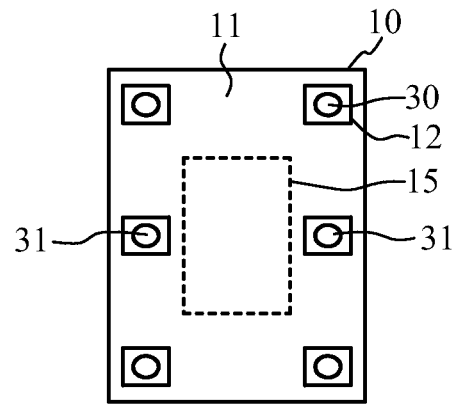
FIG. 3A through FIG. 3C are plan views of an acoustic wave device in accordance with a second comparative example.
Figure 3B:
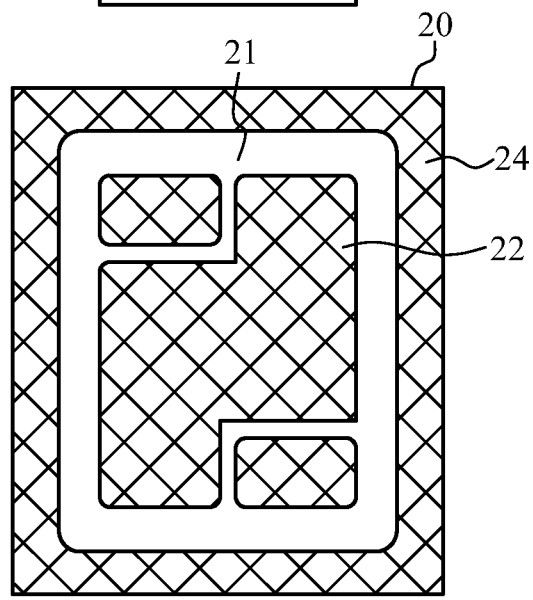
Figure 3C:
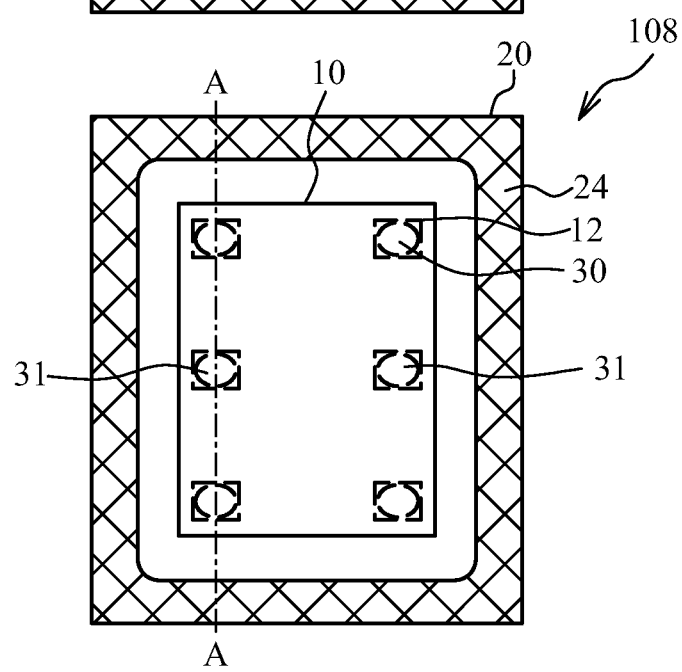

FIG. 3A through FIG. 3C are plan views of an acoustic wave device in accordance with a second comparative example. FIG. 3A is a plan view of a chip, FIG. 3B is a plan view of a substrate, and FIG. 3C is a plan view of the substrate including the chip mounted thereon. As illustrated in FIG. 3A, two pads 12 and two bumps 31 are additionally formed on the lower surface 11 of the chip 10 in comparison with FIG. 1A of the first comparative example. Other structures are the same as those illustrated in FIG. 1A, and a description thereof is omitted. As illustrated in FIG. 3B, the substrate 20 of the second comparative example is the same as that of the first comparative example, and a description thereof is omitted. As illustrated in FIG. 3C, in an acoustic wave device 108, all the bumps 30 and the added bumps 31 are bonded to the pads 22. Other structures are the same as those illustrated in FIG. 1C, and a description thereof is omitted.

Figure 4:
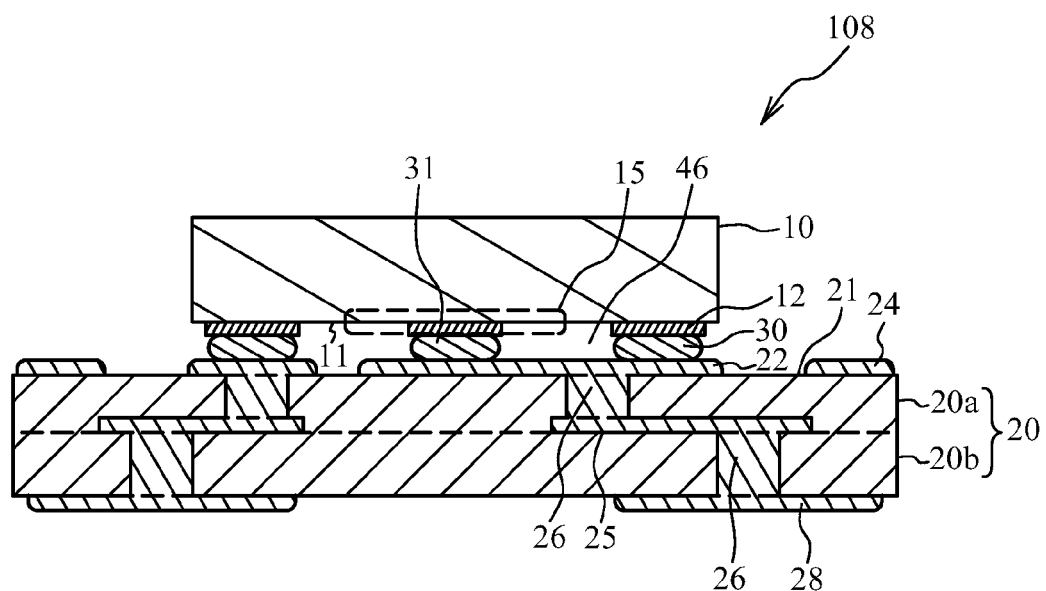
FIG. 4 is a cross-sectional view of the acoustic wave device of the second comparative example.

FIG. 4 is a cross-sectional view of the acoustic wave device in accordance with the second comparative example, and corresponds to a cross-sectional view taken along line A-A in FIG. 3C. The added bumps 31 and the bumps 30 are bonded to the pads 22. Therefore, in the second comparative example, the chip 10 is reinforced by the bumps 31 in addition to the bumps 30, and thus the strength of the chip 10 is enhanced.

However, the bumps 30 and 31 are crushed by flip-chip bonding. Thus, the sizes of the pads 12, 13 and 22 are determined in consideration of the sizes of the crushed bumps 30 and 31. Therefore, when the bumps 31 are added, the size of the chip 10 increases. Accordingly, the second comparative example has difficulty in reducing the size compared to the first comparative example. The bondability of the bump 30 increases as the number of the bumps 30 decreases. Therefore, the bondability of the bump 30 in the second comparative example is worse than that in the first comparative example. Furthermore, in the second comparative example, the addition of the metal affects electric characteristics, for example, increases capacitive coupling between the pads.

First Embodiment

Figure 5:
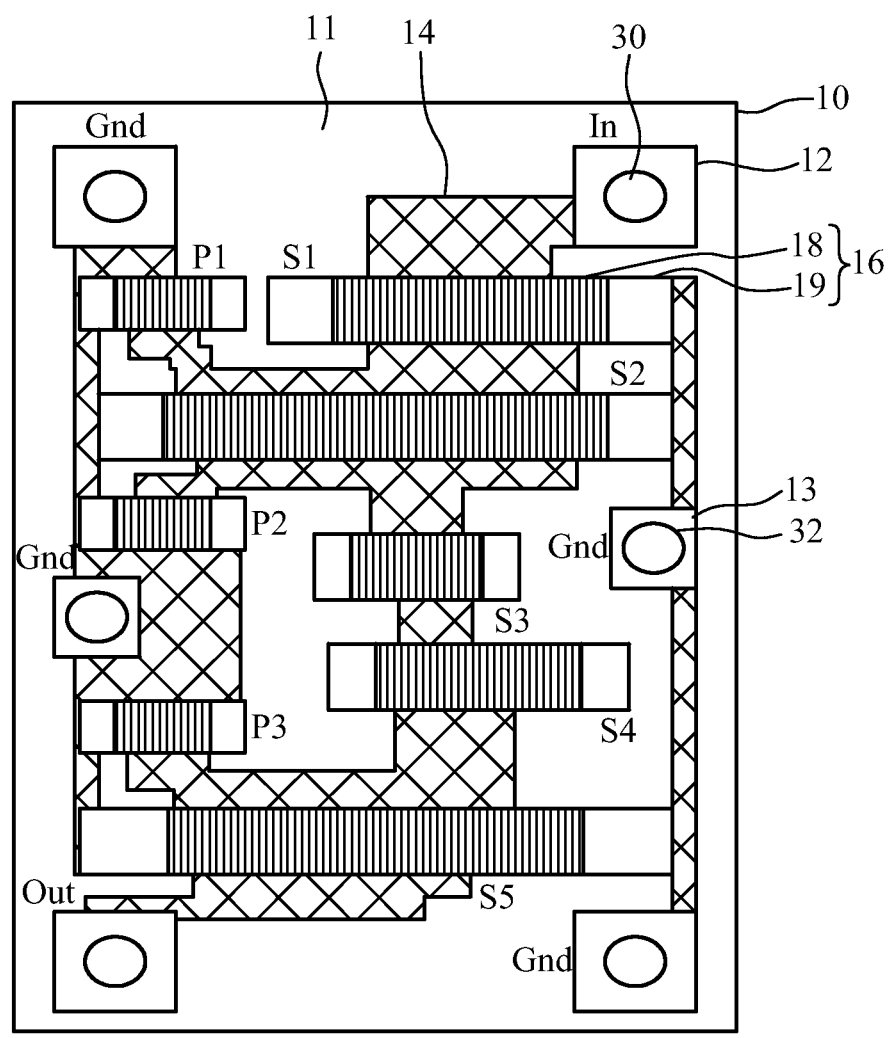
FIG. 5 is a plan view of a chip used in an acoustic wave device in accordance with a first embodiment.

FIG. 5 is a plan view of a chip used in an acoustic wave device in accordance with a first embodiment. As illustrated in FIG. 5, the pads 12 (first pad) and 13, wirings 14, and resonators 16 are formed on the lower surface 11 (principal surface) of the chip 10. The chip 10 includes a piezoelectric substrate made of, for example, lithium tantalate or lithium niobate. In addition, the chip 10 may include a support substrate mainly containing sapphire and a piezoelectric substrate bonded under the support substrate. The pads 12, 13 and the wirings 14 are formed of a metal layer formed on the lower surface of the piezoelectric substrate, and includes an Al (aluminum) film, a Ti (titanium) film and an Au (gold) film in this order from the piezoelectric substrate side. The resonator 16 includes an IDT (Interdigital Transducer) 18 and reflectors 19. The IDT 18 and the reflectors 19 are made of a metal film formed on the lower surface of the piezoelectric substrate, and are made of, for example, Al including Cu. Series resonators S1 to S5 and parallel resonators P1 to P3 are formed as the resonators 16.

The bumps 30 (first bump) are formed below the pads 12, and bumps 32 (second bump) are formed below the pads 13. The bumps 30 and 32 mainly contain a metal, and are, for example, Au stud bumps. The bumps 30 and 32 may be solder bumps. The bumps 30 include a bump functioning as an input terminal In, a bump functioning as an output terminal Out, and a bump functioning as a ground terminal Gnd. The bump 32 functions as the ground terminal Gnd. The bump 32 may be floating. The series resonators S1 through S5 are connected in series through the wirings 14 between the input terminal In and the output terminal Out. The parallel resonators P1 through P3 are connected in parallel through the wirings 14 between the input terminal In and the output terminal Out. First ends of the parallel resonators P1 through P3 and the reflectors are connected to the ground terminal Gnd. This structure forms a ladder-type filter.

Figure 6A:
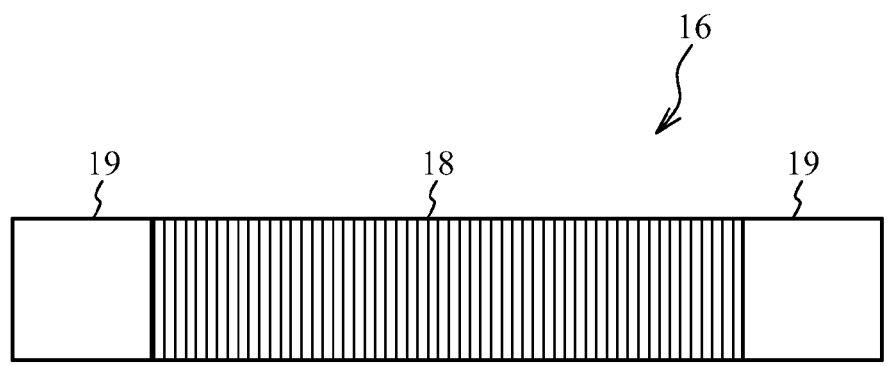
FIG. 6A and FIG. 6B are plan views illustrating a resonator.
Figure 6B:
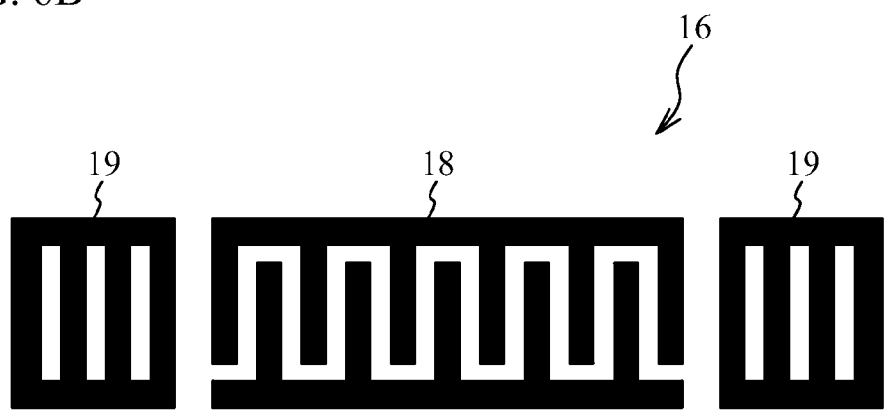

FIG. 6A and FIG. 6B are plan views illustrating the resonator. With reference to FIG. 6A, FIG. 5 omits the illustration of the IDT 18 and the reflectors 19 of the resonator 16. In FIG. 6B, the IDT 18 and the reflectors 19 are made of a metal film formed on the lower surface of the piezoelectric substrate. The IDT 18 includes two comb-shaped electrodes. The reflectors 19 are formed at both sides of the IDT in the propagation direction of the acoustic wave. The number of pairs of the electrode fingers may be arbitrarily determined.

Figure 7A:
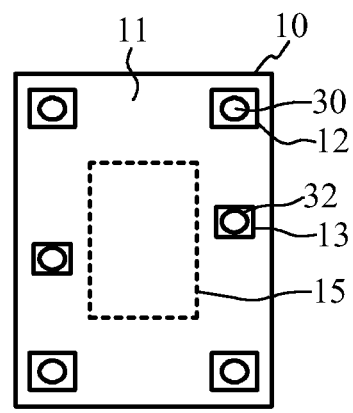
FIG. 7A through FIG. 7C are plan views of the acoustic wave device in accordance with the first embodiment.
Figure 7B:
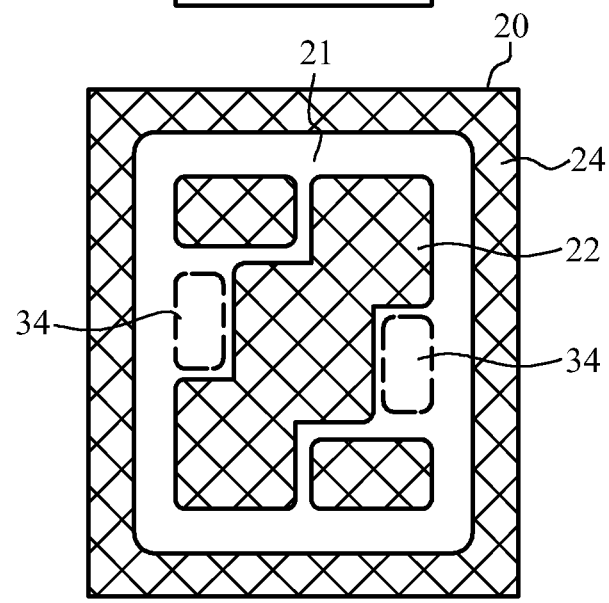
Figure 7C:
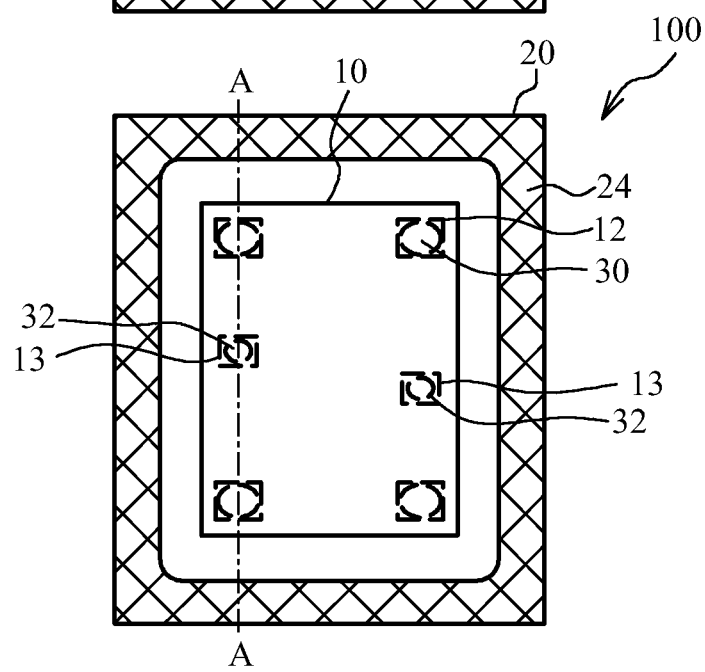

FIG. 7A through FIG. 7C are plan views of the acoustic wave device of the first embodiment. FIG. 7A is a plan view of a chip, FIG. 7B is a plan view of a substrate, and FIG. 7C is a plan view of the substrate including the chip mounted thereon. As illustrated in FIG. 7A, the chip 10 is the chip illustrated in FIG. 5, and has the same structure as the chip illustrated in FIG. 3A of the second comparative example. Therefore, a description thereof is omitted. As illustrated in FIG. 7B, in the substrate 20 of the first embodiment, the bumps 32 are bonded to regions 34 in which the pads 22 are not formed. Other structures are the same as those illustrated in FIG. 3B of the second comparative example, and thus a description thereof is omitted. As illustrated in FIG. 7C, in an acoustic wave device 100, the chip 10 is flip-chip mounted on the substrate 20. Other structures are the same as those illustrated in FIG. 3C, and a description thereof is omitted.

Figure 8A:
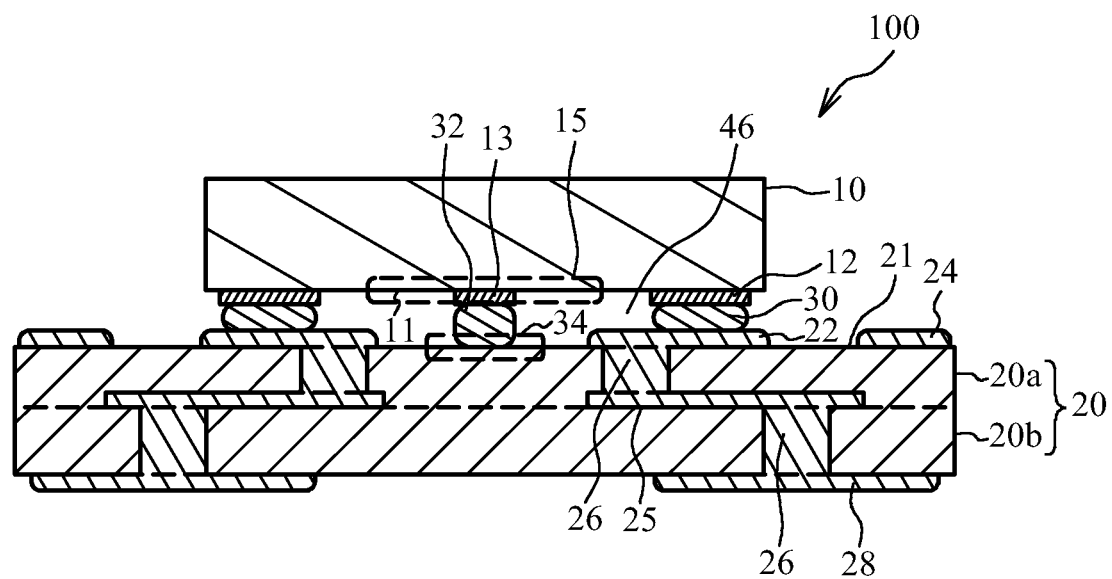
FIG. 8A and FIG. 8B are cross-sectional views of the acoustic wave device of the first embodiment.
Figure 8B:
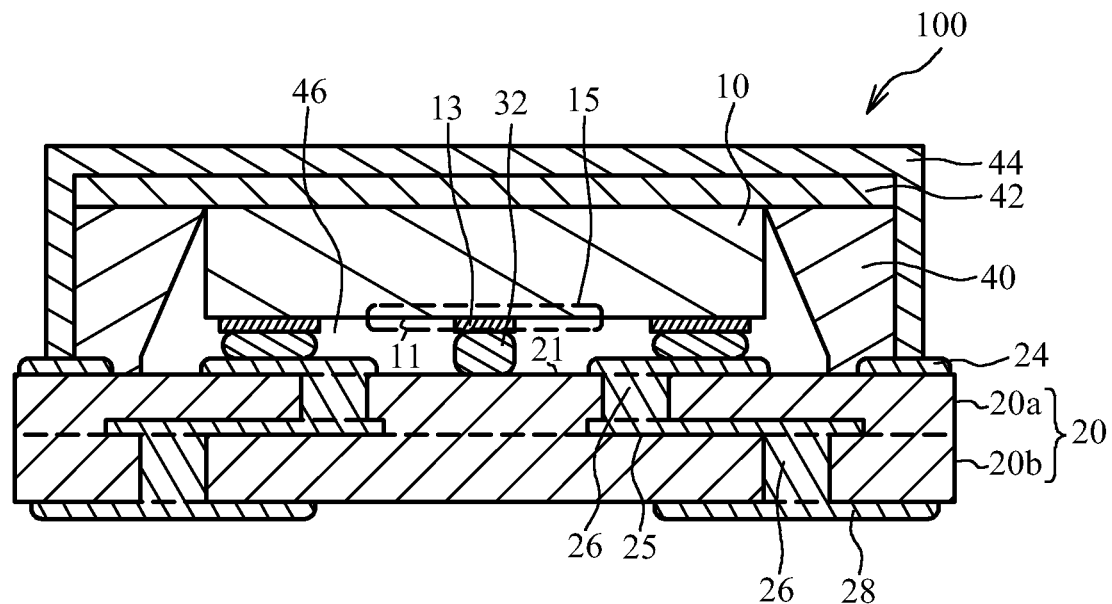

FIG. 8A and FIG. 8B are cross-sectional views of the acoustic wave device of the first embodiment. FIG. 8A is a cross-sectional view taken along line A-A in FIG. 7C. In FIG. 8A, the substrate 20 is an insulative substrate, and mainly contains ceramic or a resin. The substrate 20 is, for example, a multilayered substrate including the insulating layers 20a and 20b. The upper surface 21 (principal surface) of the substrate 20 faces the lower surface 11 of the chip 10. The pads 22 (second pad) and the annular metal layer 24 are formed on the upper surface 21 of the substrate 20. The pads 22 and the annular metal layer 24 include a Ti film and an Au film in this order from the substrate 20 side. In the substrate 20, formed are the via wirings 26 penetrating through the insulating layers 20a and 20b making up the substrate 20 and the wirings 25 formed in the boundary face between the insulating layers 20a and 20b. The foot pads 28 electrically connected to the outside are formed on the lower surface of the substrate 20 (the surface opposite to the upper surface 21). The foot pad 28 is electrically connected to the pad 22 through the wiring 25 and the via wirings 26. The pads 22, the annular metal layer 24, the wirings 25, the via wirings 26, and the pads 28 mainly contain a metal such as Au or Cu.

The bump 30 is located between the pads 12 and 22, and electrically and mechanically connects the pads 12 and 22. The bump 32 is formed between a region, in which the pad 22 is not formed, of the upper surface 21 of the substrate 20 and the lower surface 11 of the chip 10, and mechanically connects the chip 10 and the substrate 20. When the bumps 30 and 32 mainly contain Au, the bumps 30 and 32 are bonded to the substrate 20 by applying weight and ultrasonic waves to the chip 10. When the bumps 30 and 32 mainly contain solder, the bumps 30 and 32 are bonded to the substrate 20 by applying weight and heat to the chip 10. In both cases, the weight is applied to the chip 10, and thus the bump 30 is crushed.

As illustrated in FIG. 8B, a sealing portion 40 is formed on the substrate 20 so as to surround the chip 10. The sealing portion 40 is a member sealing the chip 10, and is a metal such as solder or an insulating material such as a resin. When the sealing portion 40 is solder, the annular metal layer 24 bonds the sealing portion 40 to the substrate 20. A lid 42 is located on the chip 10. The lid 42 is a plain plate such as a metal plate or an insulative plate. A protective film 44 is formed so as to cover the sealing portion 40 and the lid 42. The protective film 44 is a metal film or an insulating film, and is, for example, a plated Ni (nickel) film. The sealing portion 40 and the lid 42 secures the air-space 46 between the lower surface 11 of the chip 10 and the upper surface 21 of the substrate 20. The air-space 46 prevents the vibration of the IDT 18 and the reflectors 19 from being interrupted.

Figure 9A:
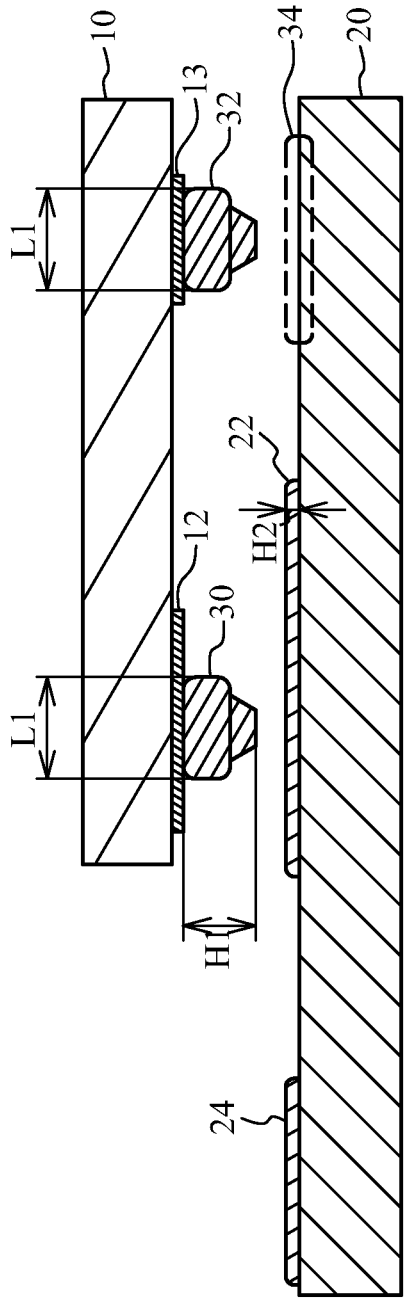
FIG. 9A and FIG. 9B are cross-sectional views illustrating sizes of bumps in the first embodiment.
Figure 9B:
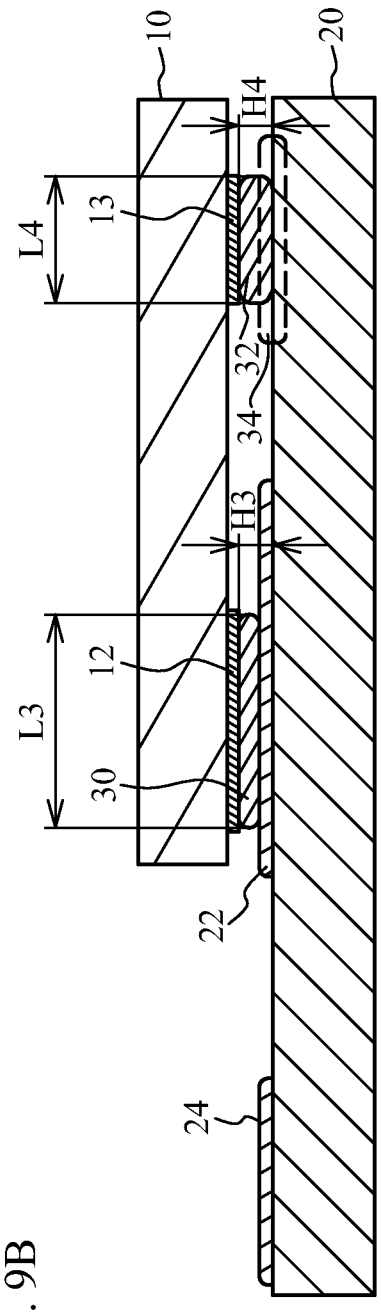

FIG. 9A and FIG. 9B are cross-sectional views illustrating sizes of the bumps in the first embodiment. As illustrated in FIG. 9A, before the chip 10 is flip-chip mounted on the substrate 20, the bumps 30 and 32 have heights H1 of 40 µm and widths L1 of 75 µm. The bumps 30 and 32 are Au stud bumps. The pad 22 has a film thickness H2 of 10 µm. The chip 10 has a thickness of, for example, 100 µm.

As illustrated in FIG. 9B, after the chip 10 is flip-chip mounted on the substrate 20, the bump 30 has a height H3 of 15 µm and a width L3 of 120 µm. The bump 32 has a height H4 of 25 µm and a width L4 of 93 µm. Accordingly, the area of the pad 13 for the bump 32 can be approximately 60% of the area of the pad 12 for the bump 30.

As illustrated in FIG. 9A, before the flip-chip mounting process, the volumes of the bumps 30 and 32 are practically the same. As illustrated in FIG. 9B, after the flip-chip mounting process, the height H4 of the bump 32 is greater than the height H3 of the bump 30. Therefore, the width L4 of the bump 32 is less than the width L3 of the bump 30.

In the first embodiment, the bumps 30 and 32 are located between the chip 10 and the substrate 20. Therefore, enhanced is the strength of the chip 10 against the impact from the upper surface of the chip indicated by the arrow 50 in FIG. 2. The bump 32 is a bump for mechanical reinforcement, and may not be electrically connected to the substrate 20. Thus, the pads 22 are not formed under the bumps 32. That is to say, the bump 32 makes direct contact with the substrate 20. This structure allows the width L4 of the bump 32 to be less than that of the bump 30 as illustrated in FIG. 9B. Therefore, the size of the acoustic wave device can be reduced. Or, a degree of freedom for design in the chip 10 can be increased. In addition, the bump 32 is not crushed as much as the bump 30 during the flip-chip mounting process, and thus the bondability of the bump 32 is hardly affected. Therefore, the first embodiment can improve the bondability of the bump compared to the second comparative example. Furthermore, the area of the pad 22 becomes small, and thus the effect of the pad 22 on electrical characteristics can be reduced.

As the bump 32 is not electrically connected to the pad 22, the electric coupling through the bump 32 is suppressed. Therefore, the bump 32 can be prevented from affecting electric characteristics.

The air-space 46 is formed between the upper surface 21 of the substrate 20 and a vibration region of the acoustic wave element 15. This structure can prevent the interruption of the vibration of the IDT. Additionally, even when a reinforcing agent such as an underfill is not located, the strength of the chip 10 can be enhanced.

When the bumps 30 and 32 are formed of stud bumps, the volumes of the bumps 30 and 32 are practically the same. The width L4 of the bump 32 can be made narrow also in this case as illustrated in FIG. 9B. The practically same volume means that the volumes are the same within a range including production tolerance.

Second Embodiment

Figure 10A:
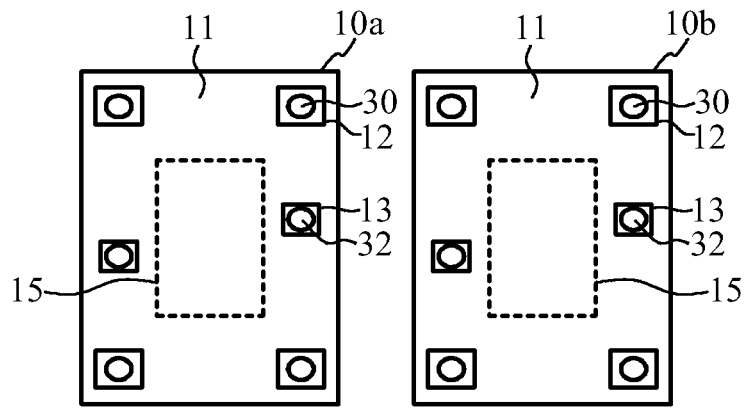
FIG. 10A through FIG. 10C are plan views of an acoustic wave device in accordance with a second embodiment.
Figure 10B:
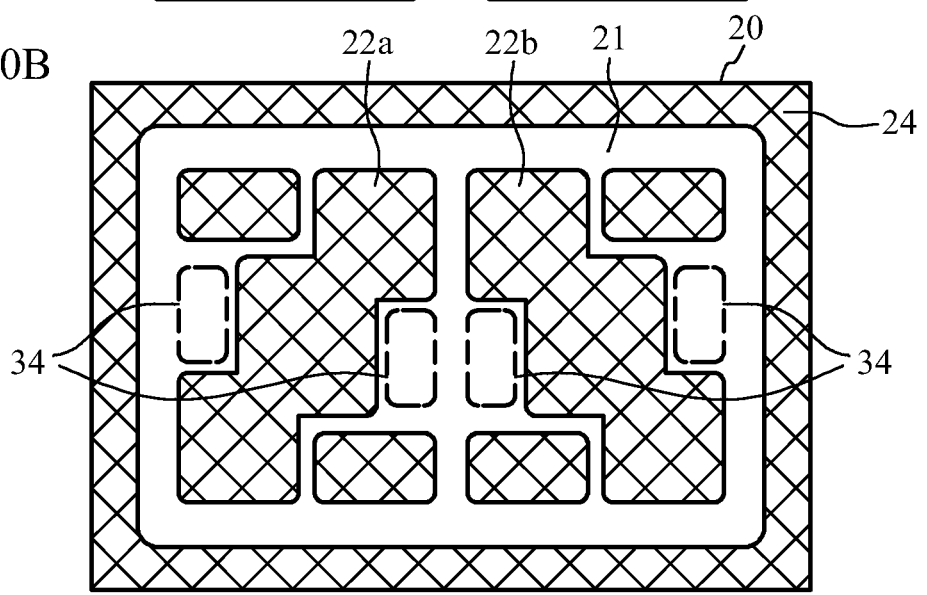
Figure 10C:
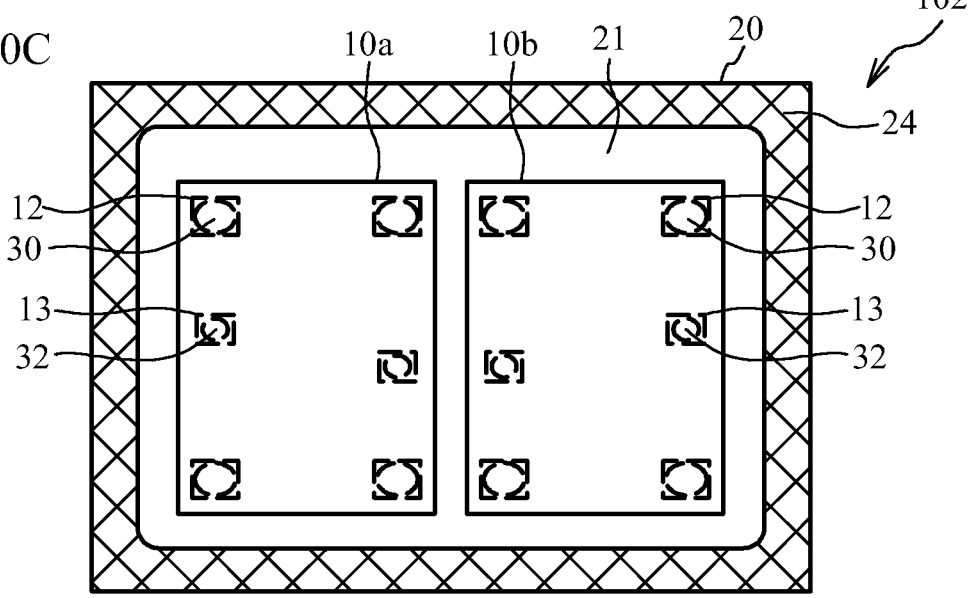

A second embodiment describes a case where an acoustic wave device includes multiple chips. FIG. 10A through FIG. 10C are plan views of an acoustic wave device in accordance with the second embodiment. FIG. 10A is a plan view of a chip, FIG. 10B is a plan view of a substrate, and FIG. 10C is a plan view of the substrate including the chip mounted thereon. As illustrated in FIG. 10A, two chips 10a and 10b are prepared. The chips 10a and 10b may be the same chip or different chips. Other structures are the same as those illustrated in FIG. 7A of the first embodiment, and a description thereof is omitted.

As illustrated in FIG. 10B, pads 22a and 22b on which the chips 10a and 10b are mounted respectively are formed on the upper surface 21 of the substrate 20 of the second embodiment. The pad 22 is not formed in the region 34 to which the bump 32 is bonded. Other structures are the same as those illustrated in FIG. 7B of the first embodiment, and a description thereof is omitted. In FIG. 10C, the chips 10a and 10b are flip-chip mounted on the substrate 20 in an acoustic wave device 102. Other structures are the same as those illustrated in FIG. 7C, and a description thereof is omitted.

The acoustic wave device 102 is, for example, a duplexer. A receive filter and a transmit filter are formed in the chips 10a and 10b, respectively.

A ladder-type filter is used as an example of the acoustic wave element 15 formed in the chip 10, but the acoustic wave element 15 may be a multimode filter. The acoustic wave element 15 may be a resonator or a duplexer. The vibration region of the acoustic wave element 15 includes at least the electrode finger of the IDT. In addition, the acoustic wave element may include a piezoelectric thin film resonator. When the acoustic wave element includes a piezoelectric thin film resonator, the chip 10 may include a glass substrate, a quartz substrate, or a silicon substrate as an insulative substrate or a semiconductor substrate. In this case, the vibration region of the acoustic wave element 15 includes at least the resonance region.

Although the embodiments of the present invention have been described in detail, it is to be understood that the various change, substitutions, and alterations could be made hereto without departing from the spirit and scope of the invention.

What is claimed is:

1. An acoustic wave device comprising:
   a chip;
   an acoustic wave element formed on a principal surface of the chip;
   a first pad formed on the principal surface of the chip and electrically connected to the acoustic wave element;
   a substrate having a principal surface facing the principal surface of the chip;
   a second pad formed on the principal surface of the substrate;
   a first bump formed between the first pad and the second pad and electrically connecting the first pad and the second pad; and
   a second bump formed between the chip and the substrate and making direct contact with the substrate,
   wherein a width of the second bump is less than a width of the first bump.

2. The acoustic wave device according to claim 1, wherein the second bump is not electrically connected to the second pad.

3. The acoustic wave device according to claim 1, wherein a volume of the first bump is practically equal to a volume of the second bump.

4. The acoustic wave device according to claim 1, further comprising:

a pad formed on a surface opposite to the principal surface of the substrate and electrically connected to the second pad.

5. The acoustic wave device according to claim 1, wherein a plurality of the chips are provided.

6. The acoustic wave device according to claim 1, wherein a plurality of the first bumps are provided, the second bump is located between the plurality of the first bumps.

7. The acoustic wave device according to claim 6, wherein the chip has a rectangular shape in a planar view, the plurality of first bumps are located at corners of the chip in the planar view respectively, and the second bump is located at a side of the chip in the planar view.

8. The acoustic wave device according to claim 7, wherein the second bump is located at a long side of the chip in the planar view.

9. The acoustic wave device according to claim 1, wherein a height of the second bump is greater than a height of the first bump.

* * * * *